United States Patent
Jun et al.

(10) Patent No.: US 9,184,031 B2
(45) Date of Patent: Nov. 10, 2015

(54) PLASMA EQUIPMENT AND METHODS OF USING THE SAME

(75) Inventors: Hyun Su Jun, Hwaseong-si (KR); YongKyu Kim, Osan-si (KR); DooByeong Park, Osan-si (KR); Bongsun Kim, Hwaseong-si (KR); Dongbock Lee, Suwon-si (KR); Minjae Na, Suwon-si (KR); Dongyoon Lee, Yongin-si (KR); Jaehong Jeong, Suwon-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 689 days.

(21) Appl. No.: 13/550,303

(22) Filed: Jul. 16, 2012

(65) Prior Publication Data

US 2013/0103347 A1   Apr. 25, 2013

(30) Foreign Application Priority Data

Oct. 19, 2011  (KR) .................. 10-2011-0107064

(51) Int. Cl.
*G01F 19/00* (2006.01)
*H01J 37/32* (2006.01)

(52) U.S. Cl.
CPC ..... *H01J 37/32944* (2013.01); *H01J 37/32972* (2013.01)

(58) Field of Classification Search
CPC ................. H01J 37/32972; H01J 37/32944
USPC ......................................................... 702/181
See application file for complete search history.

(56) References Cited

U.S. PATENT DOCUMENTS

| | | | |
|---|---|---|---|
| 7,012,684 B1* | 3/2006 | Hunter | 356/237.5 |
| 7,514,936 B2 | 4/2009 | Anwar et al. | |
| 2009/0151871 A1 | 6/2009 | Pease et al. | |
| 2009/0280581 A1 | 11/2009 | Hudson | |
| 2010/0009469 A1* | 1/2010 | Kai et al. | 438/7 |
| 2010/0161278 A1 | 6/2010 | Miyano et al. | |
| 2010/0201370 A1 | 8/2010 | Coumou et al. | |
| 2010/0258246 A1 | 10/2010 | Iwakoshi et al. | |
| 2011/0215072 A1* | 9/2011 | Park et al. | 216/67 |

FOREIGN PATENT DOCUMENTS

| | | |
|---|---|---|
| JP | 2003173896 | 6/2003 |
| KR | 20-0417571 | 5/2006 |
| KR | 1020060094467 | 8/2006 |
| KR | 1020080006750 | 1/2008 |
| KR | 10-2008-0107824 A | 12/2008 |
| KR | 10-2009-0042576 A | 4/2009 |
| KR | 10-2010-0048521 A | 5/2010 |
| KR | 10-2011-0016788 A | 2/2011 |
| KR | 10-1020076 | 3/2011 |

* cited by examiner

*Primary Examiner* — Tung S Lau
*Assistant Examiner* — Xiuquin Sun
(74) *Attorney, Agent, or Firm* — F. Chau & Associates, LLC (57) ABSTRACT

Plasma equipments are provided. The plasma equipment includes a chamber in which a plasma reaction occurs, a detector outputting a spectrum signal in response to light generated from the plasma reaction, and a plasma monitoring module determining whether the spectrum signal includes an arcing signal or a hunting signal. Related methods are also provided.

6 Claims, 10 Drawing Sheets

PLASMA EQUIPMENT AND METHODS OF USING THE SAME

CROSS-REFERENCE TO RELATED APPLICATIONS

This U.S. non-provisional patent application claims priority under 35 U.S.C. §119 to Korean Patent Application No. 10-2011-0107064, filed on Oct. 19, 2011, the disclosure of which is hereby incorporated by reference in its entirety.

TECHNICAL FIELD

Embodiments of the present disclosure herein relate to apparatuses used for fabrication of semiconductor devices and more particularly to plasma equipment and methods of using the same.

DISCUSSION OF RELATED ART

Semiconductor devices may be fabricated by many processes including deposition and etching. The etching process may be performed by plasma equipment in which a plasma reaction is induced. Plasma processing conditions may be initially set and occasionally vary due to equipment tolerances. Thus, there is a need for an apparatus and method of monitoring abnormal states of the plasma equipment in real time.

SUMMARY

Exemplary embodiments are directed to plasma equipments and methods of using the same.

According to an embodiment, plasma equipment includes a chamber in which a plasma reaction occurs, a detector outputting a spectrum signal in response to light generated from the plasma reaction, and a plasma monitoring module determining whether the spectrum signal includes an arcing signal or a hunting signal.

The plasma monitoring module may include a high pass filter outputting a high frequency signal in response to the spectrum signal. The high pass filter may remove low frequency noise signals from the spectrum signal. The plasma monitoring module may further include a probability analyzer that applies amplitude variation of the high frequency signal to a probability function to determine whether the high frequency signal includes the arcing signals and/or the hunting signals. The probability function may include a Gaussian distribution function. The Gaussian distribution function may include an amplitude and a variance of the high frequency signal as variable parameters. The probability analyzer may calculate a normalized probability value of the high frequency signal using the Gaussian distribution function and may regard a signal having an amplitude over the normalized probability value as the arcing signal or the hunting signal. The plasma monitoring module may further include a gain adjustor amplifying the spectrum signal and an analog-to-digital converter converting the amplified spectrum signal into a digital signal.

According to an embodiment, a method of using plasma equipment includes obtaining a spectrum signal from a plasma reaction, removing a noise signal from the spectrum signal to obtain a high frequency signal, and calculating an amplitude variation rate of the high frequency signal to determine whether the high frequency signal includes an arcing signal or a hunting signal.

The high frequency signal may be obtained by a high pass filter.

The noise signal may include a low frequency signal having a frequency of about 0.5 KHz to about 5 KHz. The noise signal may be removed by differentiating amplitude variations of the spectrum signal with respect to a time faster than a period of the low frequency signals.

Determining whether the high frequency signal includes arcing signals and/or hunting signals may include applying an amplitude of the high frequency signal to a variable parameter of a probability function, calculating a normalized probability value of the probability function, and regarding signals having an amplitude over the normalized probability value as the arcing signal or the hunting signal. The variable parameter of the probability function may further include a variance of the high frequency signal. The amplitude of the high frequency signal may be proportional to a multiple of the variance.

BRIEF DESCRIPTION OF THE DRAWINGS

The embodiments of the disclosure will become more apparent in view of the attached drawings and accompanying detailed description.

DETAILED DESCRIPTION OF THE EMBODIMENTS

Exemplary embodiments are described below with reference to the accompanying drawings. Many different forms and embodiments are possible without deviating from the spirit and teachings of this disclosure and so the disclosure should not be construed as limited to the exemplary embodiments set forth herein. The same reference numerals or the same reference designators may denote the same or substantially the same elements throughout the specification and the drawings.

The terminology used herein is for the purpose of describing particular embodiments only and is not intended to be limiting of the embodiments. As used herein, the singular forms "a," "an," and "the" are intended to include the plural forms as well, unless the context clearly indicates otherwise.

Figure 1:
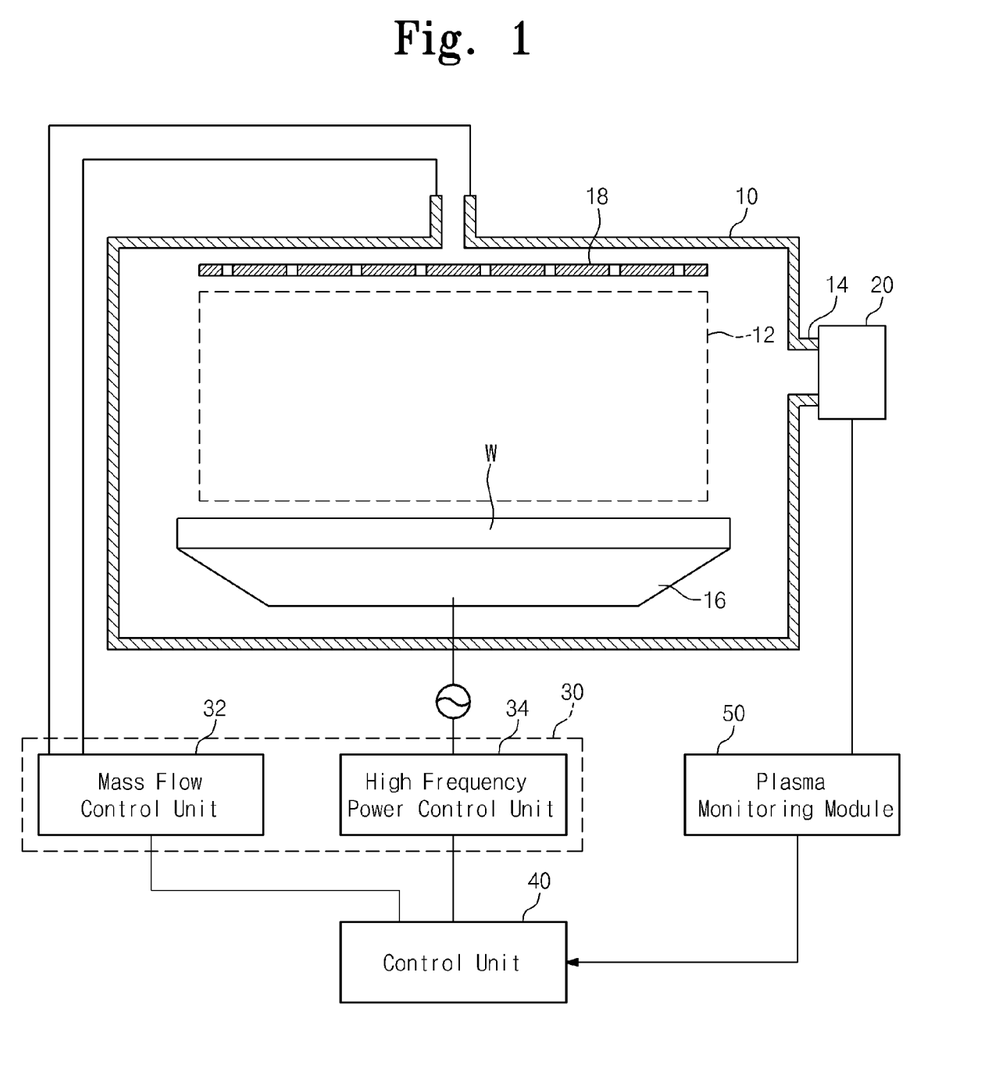
FIG. 1 is a schematic view illustrating plasma equipment according to an exemplary embodiment.
Figure 2:
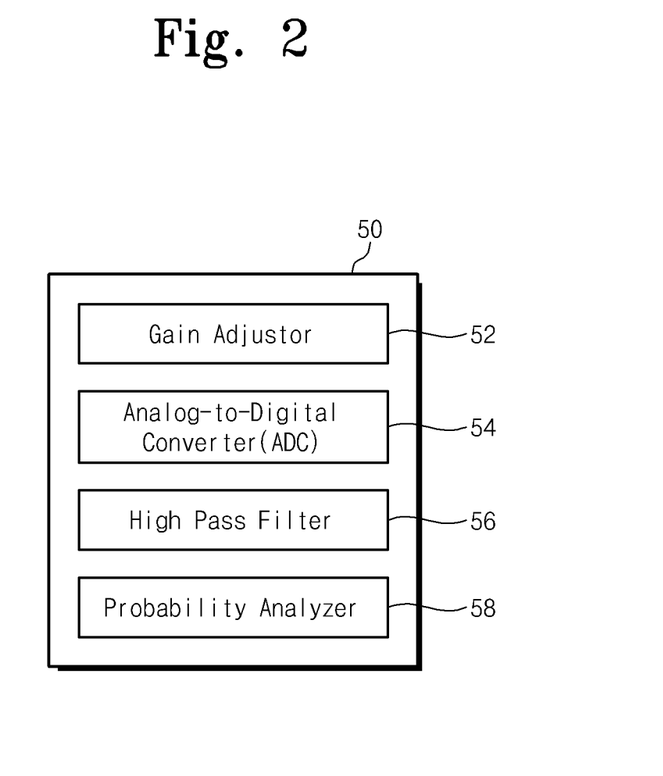
FIG. 2 is a block diagram illustrating the plasma monitoring module of FIG. 1.

FIG. 1 is a schematic view illustrating plasma equipment according to an exemplary embodiment. FIG. 2 is a block diagram illustrating the plasma monitoring module of FIG. 1, and FIG. 3 is a graph illustrating a spectrum signal accompanied by an arcing phenomenon.

Figure 3:
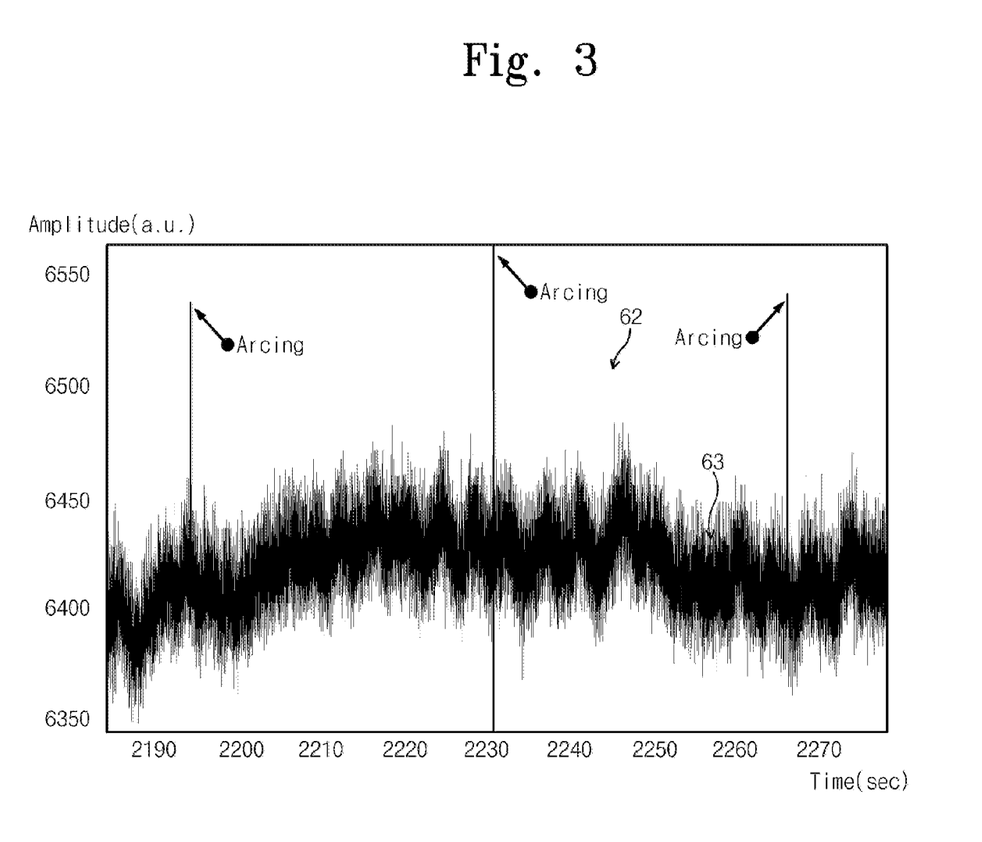
FIG. 3 is a graph illustrating a spectrum signal accompanied by an arcing phenomenon.

Referring to FIGS. 1, 2 and 3, plasma equipment according to an exemplary embodiment includes a chamber 10. The chamber 10 provides an isolated space in which a plasma reaction 12 occurs. The chamber 10 includes an etch chamber or a deposition chamber in which an etching process or a deposition process for manufacturing a semiconductor device is performed. The etching process is performed to pattern a wafer or at least one layer (e.g., at least one among a silicon layer, an oxide layer, a nitride layer and a metal layer) on the wafer in the etch chamber. The chamber 10 is spatially connected to a transfer chamber (not shown), and the transfer chamber is spatially connected to at least one load lock chamber (not shown). According to an embodiment, the chamber 10 corresponds to a main chamber. The transfer chamber and the at least one load lock chamber provide buffer spaces between an inner space of the main chamber and an external space of the main chamber. For example, the transfer chamber and the at least one load lock chamber prevent the inner space of the main chamber from being directly exposed to the external space. Thus, the main chamber maintains a high vacuum even when a wafer is loaded into the main chamber through the transfer chamber and the load lock chamber or a wafer is unloaded from the main chamber.

The plasma equipment further includes a shower head 18, a chuck 16 and a cathode (not shown) which are installed in the chamber 10. The shower head 18 supplies reaction gases into the chamber 10, and the chuck 16 is located to be opposite to the showerhead 18. A wafer W is loaded onto the chuck 16 located under the shower head 18. High frequency electric power is applied to the cathode to excite the reaction gases injected into the chamber 10. When the reaction gases and/or inert gases injected into the chamber 10 are excited, plasma is generated in the chamber 10.

The plasma equipment further includes a detector 20 that is combined with a view port 14 of the chamber 10 without use of optical fiber. The detector 20 includes a photodiode that receives light from the plasma generated in the chamber 10. The detector 20 generates and outputs a spectrum signal (62 of FIG. 3) in response to the light from the plasma.

When the plasma is generated in the chamber 10, an arcing phenomenon or a hunting phenomenon abnormally occurs. The arcing phenomenon may occur because of the presence of polymer adsorbed on an inner wall of the chamber 10 or because of the presence of a sharp point of a surface profile of the wafer W. The arcing phenomenon occurs for a time duration which is almost equal to an RC delay time of a plasma sheath. The plasma sheath corresponds to a region in which a voltage drop of the plasma is generated. A frequency of the arcing phenomenon is expressed by the following equation 1:

$$\frac{1}{R_{sheath}C_{sheath}} = \frac{1}{\Delta\tau_{arcing}} \geq 10 \text{ kHz} \quad \text{[Equation 1]}$$

In the equation 1, "$R_{sheath}$" denotes an electrical resistance of the plasma sheath, and "$C_{sheath}$" denotes a capacitance of the plasma sheath. Further, "$\Delta\tau_{arcing}$" denotes a time duration of the arcing phenomenon. For example, when the plasma sheath resistance ($R_{sheath}$), the plasma sheath capacitance ($C_{sheath}$), and the arcing time duration ($\Delta\tau_{arcing}$) are 1 KΩ to 1000 KΩ, 10 pF to 100 pF, and $1\times10^{-6}$ seconds to $1\times10^{-4}$ seconds, respectively, the arcing phenomenon exhibits a frequency of about 10 KHz to about 100 KHz.

The hunting phenomenon refers to a phenomenon wherein the spectrum signal abnormally fluctuates due to variations in the environment, e.g., variations in the electric power applied to the cathode or due to variations in a pressure in the chamber 10. For example, the hunting phenomenon occurs when the high frequency electric power ramps up or down. A relationship between a ramp-up time and a ramp-down time of the high frequency electric power and a time duration of the hunting phenomenon are expressed by the following equation 2:

$$\frac{1}{\tau_{ramp-up}} \sim \frac{1}{\tau_{ramp-down}} \leq \frac{1}{\Delta\tau_{hunting}} \quad \text{[Equation 2]}$$

In the equation 2, "$\tau_{ramp-up}$" denotes a ramp-up time of the high frequency electric power, and "$\tau_{ramp-down}$" denotes a ramp-down time of the high frequency electric power. Further, "$\Delta\tau_{hunting}$" denotes a time duration of the hunting phenomenon. For example, when each of the ramp-up time and the ramp-down time is about $1\times10^{-2}$ seconds and the time duration of the hunting phenomenon is within a range of about $1\times10^{-4}$ seconds to about $1\times10^{-3}$ seconds, the hunting phenomenon exhibits a frequency of about 1 KHz to about 10 KHz.

Hereinafter, a spectrum signal 62 including arcing signals will be described first and a spectrum signal 62 including hunting signals will be then described. The arcing signal refers to a signal included in the spectrum signal when electric arcing occurs, and the hunting signal refers to a signal when the hunting phenomenon occurs.

The plasma equipment further includes an adjustor 30. The adjustor 30 controls a flow rate of the reaction gases and high frequency electric power that directly affect the plasma reaction 12. The adjustor 30 includes a high frequency power control unit 34 and a mass flow control unit 32. The high frequency power control unit 34 includes a power generator for generating high frequency electric power and a matching box for matching an output impedance of the high frequency electric power. The mass flow control unit 32 includes a mass flow controller for controlling flow rates of gases supplied from a reaction gas supplier.

The plasma equipment further includes a control unit 40. The control unit 40 generates and outputs control signals that control the adjustor 30. The control unit 40 calculates and stores operation manual values of the adjustor 30. According to an embodiment, the control unit 40 includes an arithmetic logic unit (ALU) and a database. The database stores data including arcing signals and hunting signals that are outputted from a plasma monitoring module 50 connected to an output terminal of the detector 20. The arithmetic logic unit counts the arcing signals and the hunting signals. For example, the control unit 40 controls an overall operation of the plasma equipment such that the plasma monitoring module 50 stores and processes data relating to the spectrum signals 62 outputted from the detector 20.

The plasma monitoring module 50 includes a gain adjustor 52, an analog-to-digital converter (ADC) 54, a high pass filter 56 and a probability analyzer 58. The gain adjustor 52 amplifies the spectrum signals 62 outputted from the detector 20. The ADC 54 converts the analog spectrum signals 62 into digital signals.

Figure 4:
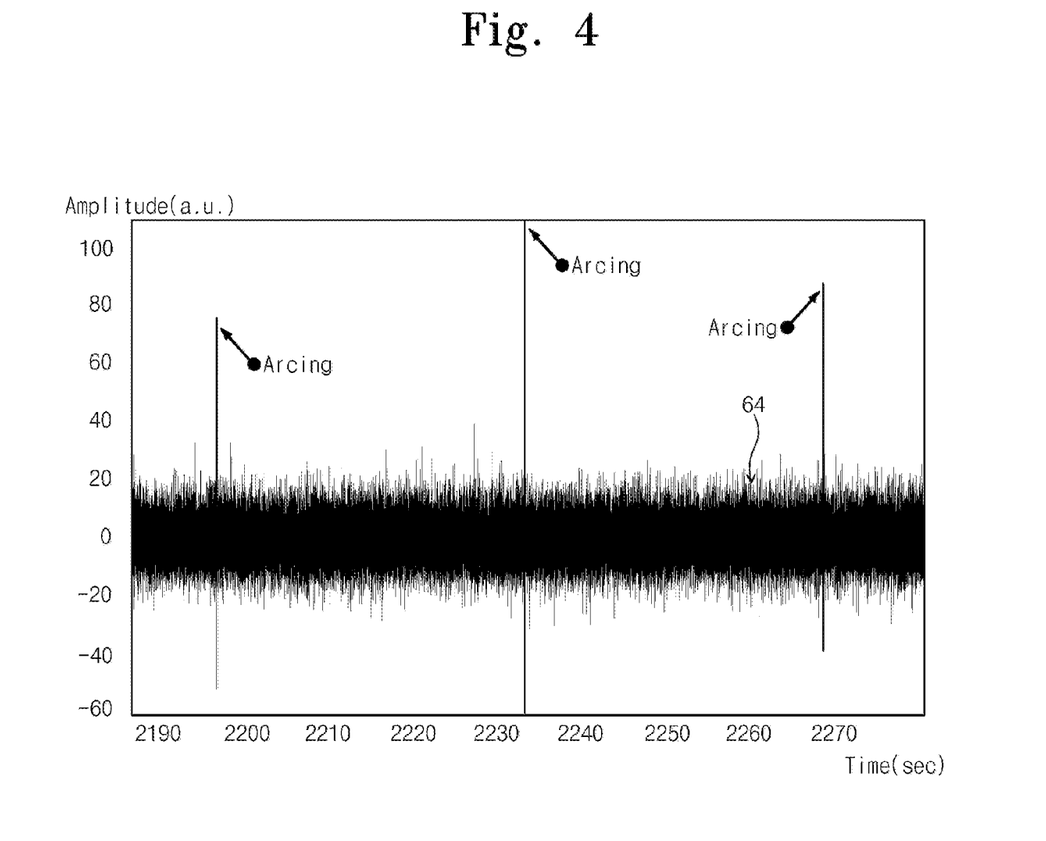
FIG. 4 is a graph illustrating a high frequency signal obtained by removing noise signals from the spectrum of FIG. 3.

FIG. 4 is a graph illustrating a high frequency signal obtained by removing noise signals from the spectrum signal 5 of FIG. 3.

Referring to FIGS. 2 to 4, the high pass filter 56 removes noise signals 63 having a low frequency from an output signal (e.g., the spectrum signal 62) of the detector 20 to generate and output a high frequency signal 64. For example, the high pass filter 56 removes the noise signals 63 from the output signal of the ADC 54 to output the high frequency signal 64 illustrated in FIG. 4. The spectrum signal 62 fluctuates up and down due to the noise signals 63 as time elapses. According to an embodiment, the high pass filter 56 removes the low frequency noise signals 63 from the spectrum signal 62 by differentiating an amplitude variation of the spectrum signal 62 with respect to a time faster than a period of the low frequency noise signals 63. For example, when the noise signals 63 have a frequency of about 5 KHz or less, the high frequency signal 64 outputted from the high pass filter 56 has a frequency of about 5 KHz or more.

Figure 5:
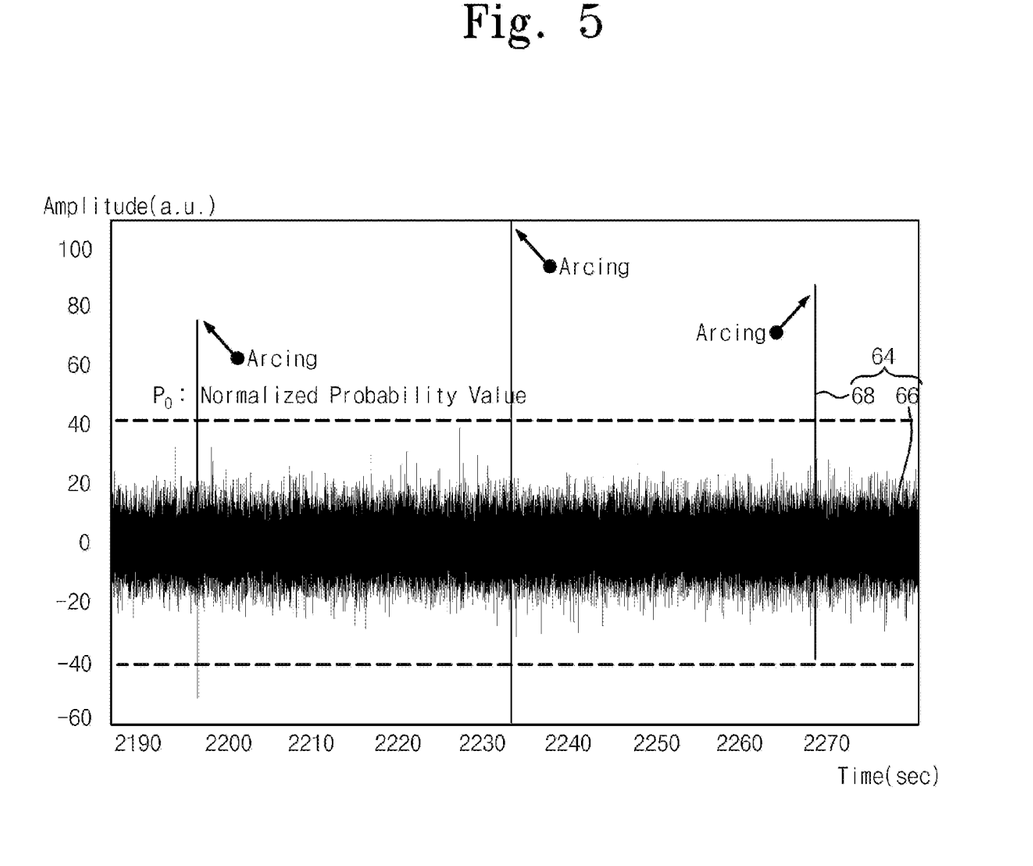
FIG. 5 is a graph illustrating a high frequency signal including a normalized probability value and a hunting probability obtained by analyzing the high frequency signal of FIG. 4.

FIG. 5 is a graph illustrating a high frequency signal including a normalized probability value and a hunting probability obtained by analyzing the high frequency signal of FIG. 4.

Referring to FIGS. 2 and 5, the probability analyzer 58 of the plasma monitoring module 50 receives arcing signals 68 having an amplitude which is greater than an amplitude of a reference signal 66 of the high frequency signal 64. The probability analyzer 58 applies amplitudes of the high frequency signal 64 to a probability function and regards signals having an amplitude more than a normalized probability value ($P_0$) of the probability function as arcing signals or hunting signals. For example, the probability function includes a Gaussian distribution function that employs an amplitude and a variance of the high frequency signal 64 as variable parameters. The Gaussian distribution function is expressed by the following equation 3:

$$P = \frac{1}{\sqrt{2\pi\sigma^2}} e^{-\frac{(x-\mu)^2}{2\sigma^2}} \qquad \text{[Equation 3]}$$

In the equation 3, "P" denotes a probability and "$\sigma$" denotes a variance. "x" denotes an amplitude and "$\mu$" denotes a mean value. The mean value ($\mu$) converges to zero. The amplitude (x) and the variance ($\sigma$) vary as time elapses. Thus, the amplitude (x) and the variance ($\sigma$) correspond to variable parameters of the Gaussian distribution function. The amplitude (x) is represented as an inverse function of the probability (P). For example, a square value of the amplitude (x) is proportional to a natural logarithm function of the probability (P). Thus, an absolute value of the amplitude (x) is expressed by the following equation 4:

$$|x| = \sigma\sqrt{2}\sqrt{-\ln(P\sqrt{2\pi\sigma^2})}, P<1, \sigma=\sigma(\Delta t) \qquad \text{[Equation 4]}$$

In the equation 4, the probability (P) is less than one and the variance ($\sigma$) is a variable parameter that varies according to the time (t). Accordingly, the absolute value of the amplitude (x) is represented as a natural logarithm function of the probability (P) that employs the variance ($\sigma$) as a variable parameter. An amplitude of the reference signal 66 of the high frequency signal 64 is proportional to a multiple of the variance ($\sigma$). For example, the amplitude (x) of the high frequency signal 64 is quantified as "$n \times \sigma(t)$". Thus, the probability (P) is expressed by the following equation 5 that employs the variance ($\sigma$) and the integer (n) as variable parameters:

$$P = \frac{1}{\sqrt{2\pi\sigma^2}} e^{-\frac{n^2}{2}}, x \equiv n\sigma \qquad \text{[Equation 5]}$$

The high frequency signal 64 includes a reference signal 66 and arcing signals 68. When the plasma reaction 12 normally occurs, the reference signal 66 has an amplitude within a range of the normalized probability value $P_0$. An amplitude of the arcing signals 68 is greater than the normalized probability value $P_0$.

The probability analyzer 58 regards a high frequency signal having an amplitude within the normalized probability value $P_0$ as the reference signal 66 and regards high frequency signals having an amplitude over the normalized probability value $P_0$ as the arcing signals 68. For example, an amplitude of the reference signal 66 is four times the variance ($\sigma$), and an amplitude of the arcing signals 68 is eight times the variance ($\sigma$). According to an embodiment, a probability ratio of an arcing probability $P_{arc}$ to the normalized probability value $P_0$ is expressed by the following equation 6:

$$\frac{P_{arc}}{P_0} = e^{-\frac{1}{2}(8^2-4^2)} \sim e^{-24} \sim 4\times 10^{-11} \qquad \text{[Equation 6]}$$

As can be seen from the equation 6, the arcing probability $P_{arc}$ is about $4\times 10^{-11}$ times less than the normalized probability value $P_0$. The probability analyzer 58 applies an amplitude variation of the high frequency signal 64 to the probability function P, thereby determining occurrence of the arcing phenomenon or the hunting phenomenon. The control unit 40 monitors histories or periods of the occurrence of the arcing signals 68 supplied from the plasma monitoring module 50. The control unit 40 sends the arcing signals 68 to a server (not shown) or a storage media.

Thus, plasma equipment according to an exemplary embodiment and a method of maintaining the plasma equipment may analyze data regarding the arcing phenomenon or the hunting phenomenon that occurs during a plasma reaction, thus increasing the throughput of semiconductor devices.

Figure 6:
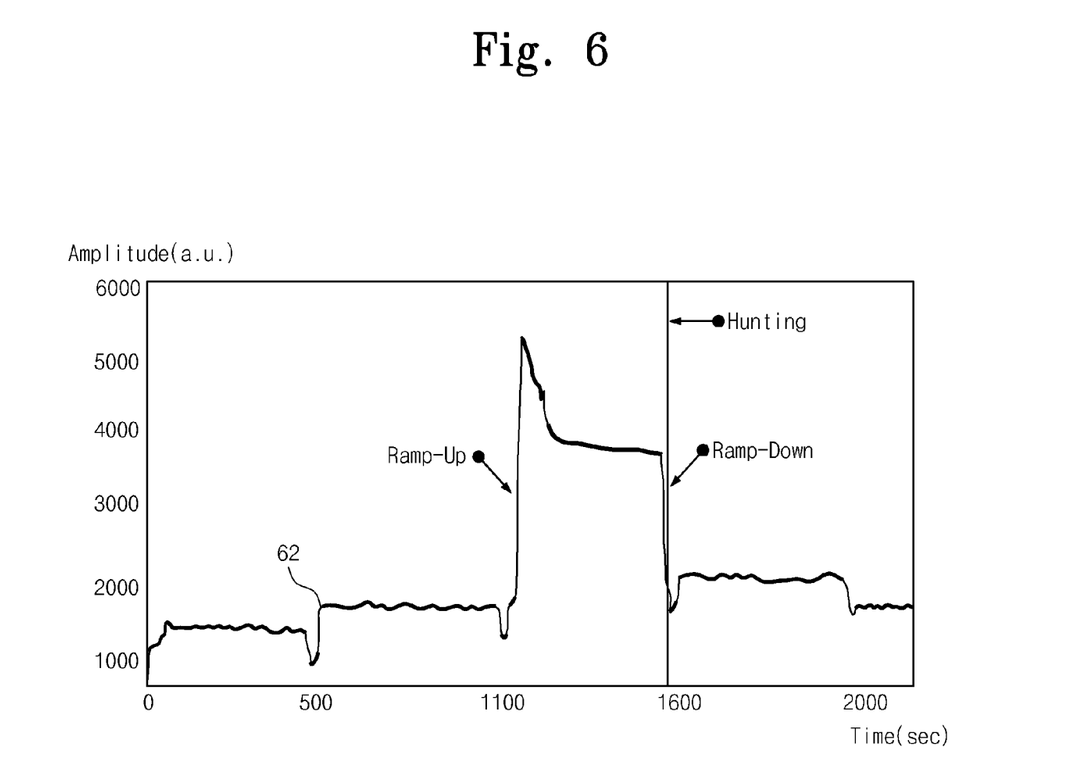
FIG. 6 is a graph illustrating a spectrum signal accompanied by a hunting phenomenon.
Figure 7:
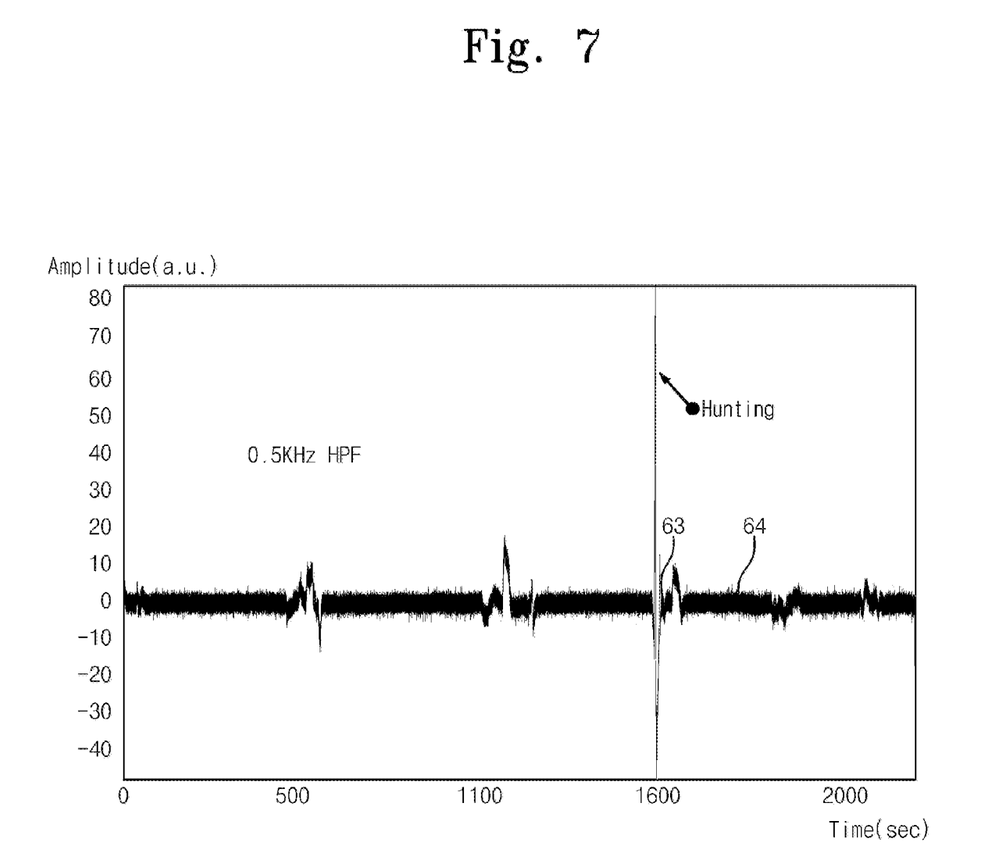
FIG. 7 is a graph illustrating a high frequency signal obtained by removing noise signals having a frequency of about 0.5 KHz or less from the spectrum of FIG. 6.
Figure 8:
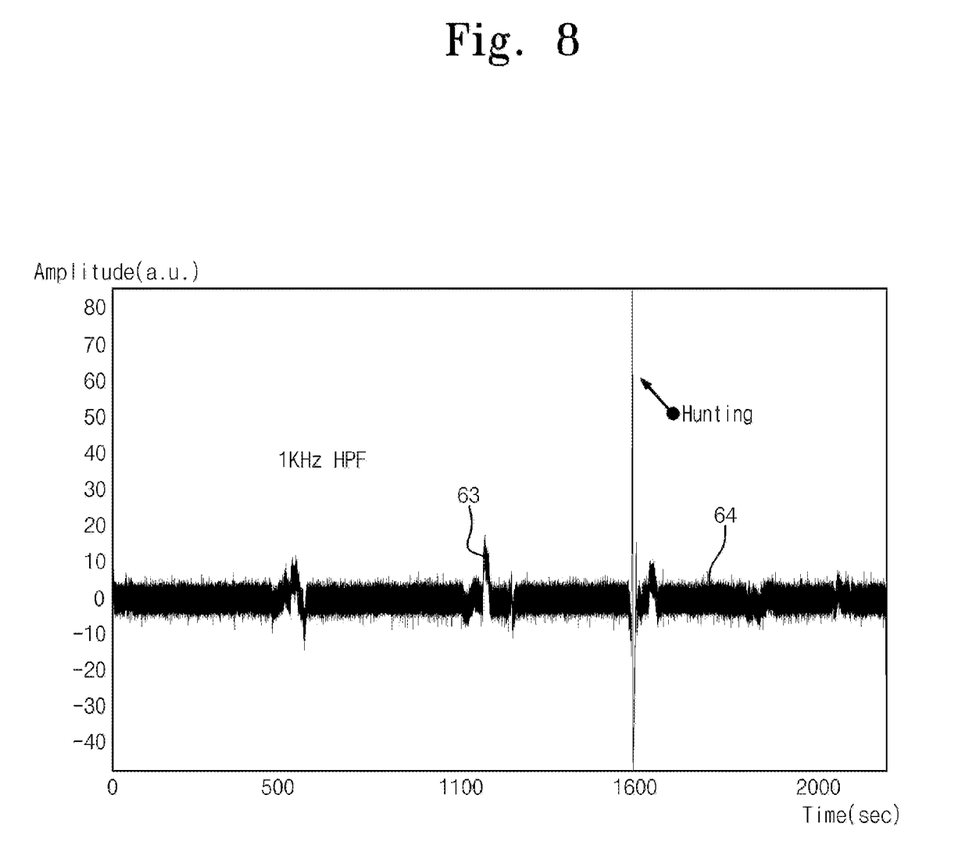
FIG. 8 is a graph illustrating a high frequency signal obtained by removing noise signals having a frequency of about 1 KHz or less from the spectrum of FIG. 6.
Figure 9:
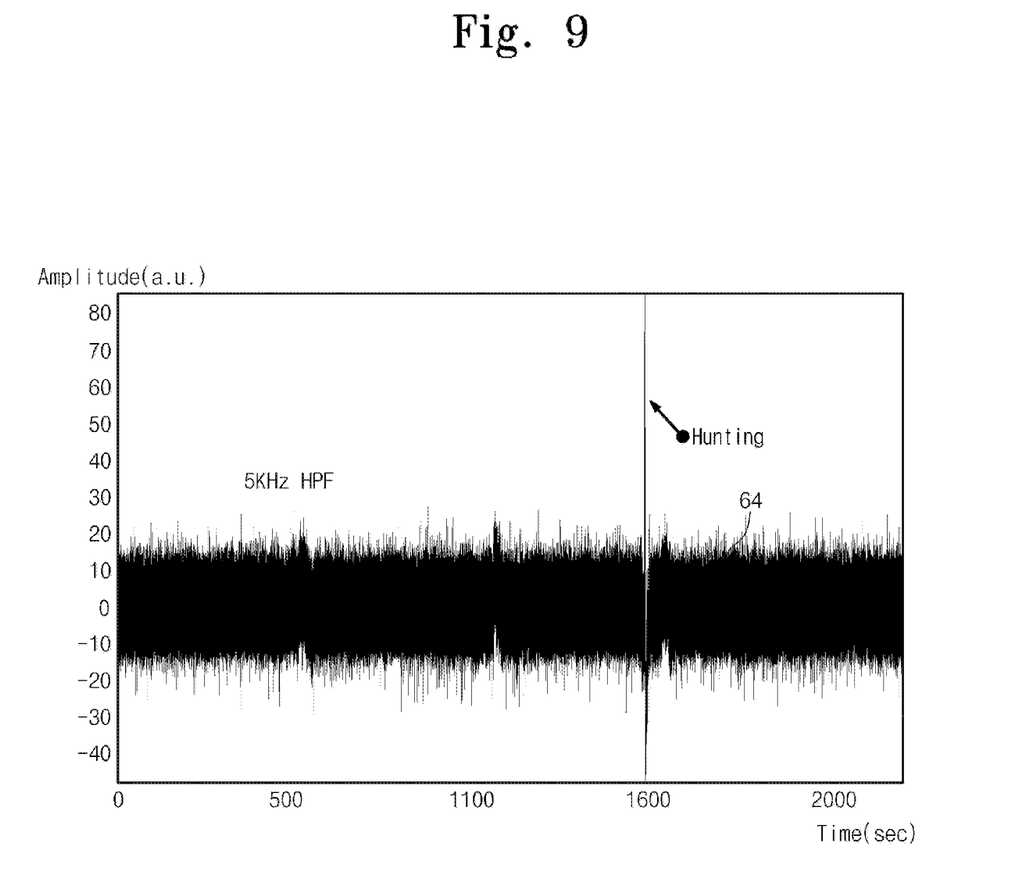
FIG. 9 is a graph illustrating a high frequency signal obtained by removing noise signals having a frequency of about 5 KHz or less from the spectrum of FIG. 6.

FIG. 6 is a graph illustrating a spectrum signal accompanied by a hunting phenomenon. FIG. 7 is a graph illustrating a high frequency signal obtained by removing noise signals having a frequency of about 0.5 KHz or less from the spectrum of FIG. 6 using a 0.5 KHz high pass filter, and FIG. 8 is a graph illustrating a high frequency signal obtained by removing noise signals having a frequency of about 1 KHz or the lower from the spectrum of FIG. 6 using a 1 KHz high pass filter. FIG. 9 is a graph illustrating a high frequency signal obtained by removing noise signals having a frequency of about 5 KHz or less from the spectrum of FIG. 6 using a 5 KHz high pass filter.

Referring to FIGS. 2, 6, 7, 8 and 9, the high pass filters 56 remove noise signals 63 having low frequencies of about 0.5 KHz to about 5 KHz from the spectrum signals 62, thereby outputting high frequency signals 64. However, as shown in FIGS. 7 and 8, the 0.5 KHz high pass filter and the 1 KHz high pass filter do not completely remove the noise signals 63 that are generated when the plasma power abruptly ramps up or down. The frequency of the noise signals 63 is higher than 0.5

KHz or 1 KHz when the plasma power abruptly ramps up or down. In contrast, the 5 KHz high pass filter completely removes the noise signals 63 from the spectrum signal 62 to output the high frequency signal 64 without any noise signals, as illustrated in FIG. 9.

Figure 10:
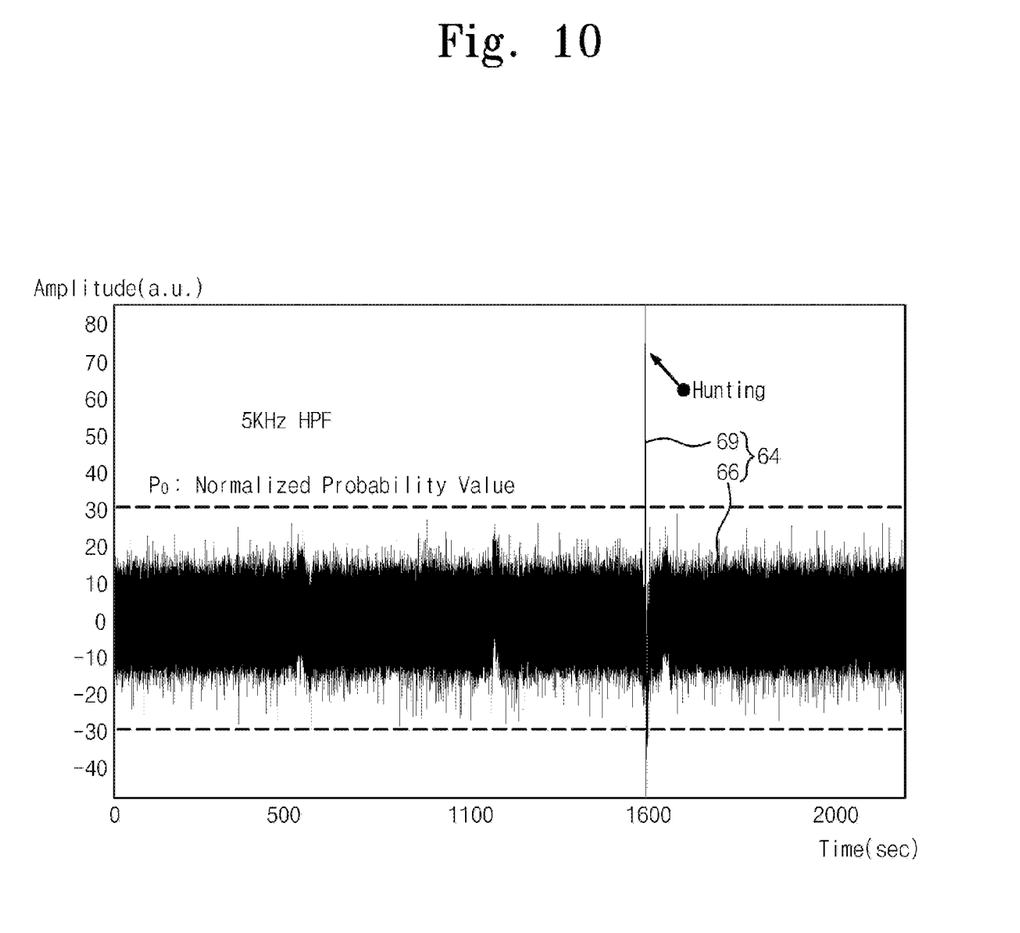
FIG. 10 is a graph illustrating a high frequency signal including a normalized probability value and a hunting probability obtained by analyzing the high frequency signal of FIG. 9.

FIG. 10 is a graph illustrating a high frequency signal including a normalized probability value and a hunting probability obtained by analyzing the high frequency signal of FIG. 9.

Referring to FIGS. 2 and 10, the probability analyzer 58 regards the high frequency signals having an amplitude over a normalized probability value $P_0$ as hunting signals 69 and regards the high frequency signal having an amplitude within the normalized probability value $P_0$ as the reference signal 66. For example, the high frequency signal 64 includes the hunting signals 69 and the reference signal 66. The probability analyzer 58 calculates the normalized probability value $P_0$ of the high frequency signal 64 using a probability distribution function of the high frequency signal 64 obtained by removing the noise signals 63 having a frequency of about 5 KHz from the spectrum signal 62. For example, according to an embodiment, the probability analyzer 58 determines the normalized probability value $P_0$ as the amplitude of the high frequency signal 64 which is about +/−30 a.u. (arbitrary unit), as illustrated in FIG. 10. The reference signal 66 has amplitudes within a range of the normalized probability value $P_0$. The hunting signals 69 have amplitudes over the normalized probability value $P_0$. The hunting signals 69 have an amplitude of about 65 (arbitrary unit). The probability analyzer 58 regards the high frequency signals having an amplitude over the normalized probability value $P_0$ as the hunting signals 69. The plasma monitoring module 50 sends histories or periods of occurrence of the hunting signals 69 to the control unit 40.

Thus, plasma equipment according to an exemplary embodiment and a method of maintaining the plasma equipment can increase the throughput of semiconductor devices.

According to an embodiment, a detector is combined with a view port of a chamber. The detector receives light from plasma generated in the chamber and generates and outputs a spectrum signal including information of the plasma in response to the light from the plasma. The spectrum signal is transmitted to a plasma monitoring module. The plasma monitoring module converts the spectrum signal having an analog form into a digital signal. The plasma monitoring module removes low frequency noise signals from the digitized spectrum signal, thereby outputting a high frequency signal. The plasma monitoring module analyzes the high frequency signal and determines whether the high frequency signal includes arcing signals and/or hunting signals. Accordingly, the plasma equipment according to an exemplary embodiment can increase the throughput of semiconductor devices.

While the embodiments of the inventive concept have been described, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. Plasma equipment comprising:
   a chamber in which a plasma reaction occurs;
   a detector configured to output a spectrum signal in response to light generated from the plasma reaction; and
   a plasma monitoring module configured to determine whether the spectrum signal includes an arcing signal or a hunting signal,
   wherein the plasma monitoring module comprises a high pass filter configured to output a high frequency signal in response to the spectrum signal,
   wherein the plasma monitoring module further comprises a probability analyzer configured to apply an amplitude variation of the high frequency signal to a probability function to determine whether the high frequency signal includes the arcing signal or the hunting signal.

2. The plasma equipment of claim 1, wherein the high pass filter is configured to remove a low frequency noise signal from the spectrum signal.

3. The plasma equipment of claim 1, wherein the probability function comprises a Gaussian distribution function.

4. The plasma equipment of claim 3, wherein the Gaussian distribution function includes an amplitude and a variance of the high frequency signal as variable parameters.

5. The plasma equipment of claim 4, wherein the probability analyzer is configured to calculate a normalized probability value of the high frequency signal using the Gaussian distribution function and regards a signal having an amplitude over the normalized probability value as the arcing signal or the hunting signal.

6. The plasma equipment of claim 1, wherein the plasma monitoring module further comprises:
   a gain adjustor configured to amplify the spectrum signal; and
   an analog-to-digital converter configured to convert the amplified spectrum signal into a digital signal.

* * * * *